(12) United States Patent
Mahran et al.

(10) Patent No.: US 9,576,615 B1
(45) Date of Patent: Feb. 21, 2017

(54) MEMORY MODULE WITH POWER MANAGEMENT SYSTEM AND METHOD OF OPERATION THEREOF

(71) Applicant: SMART Modular Technologies, Inc., Newark, CA (US)

(72) Inventors: Victor Mahran, Ladera Ranch, CA (US); Kevin James Gabrielli, San Jose, CA (US); Reuben Jun Fong Chang, Campbell, CA (US)

(73) Assignee: SMART Modular Technologies, Inc., Newark, CA (US)

( * ) Notice: Subject to any disclaimer, the term of this patent is extended or adjusted under 35 U.S.C. 154(b) by 0 days.

(21) Appl. No.: 14/884,369

(22) Filed: Oct. 15, 2015

(51) Int. Cl.
*G11C 5/14* (2006.01)
*G06F 12/02* (2006.01)
*G06F 1/32* (2006.01)

(52) U.S. Cl.
CPC .............. *G11C 5/14* (2013.01); *G06F 12/02* (2013.01); *G06F 1/32* (2013.01)

(58) Field of Classification Search
CPC ............... G11C 5/14; G06F 12/02; G06F 1/32
See application file for complete search history.

(56) References Cited

U.S. PATENT DOCUMENTS

| | | | |
|---|---|---|---|
| 7,228,446 B2 | 6/2007 | Jorgenson et al. | |
| 7,312,646 B2 | 12/2007 | Jorgenson et al. | |
| 7,337,335 B2 | 2/2008 | Jorgenson et al. | |
| 7,398,407 B2 | 7/2008 | Jorgenson et al. | |
| 7,657,764 B2 | 2/2010 | Jorgenson et al. | |
| 7,730,334 B2 | 6/2010 | Jorgenson et al. | |
| 8,020,015 B2 | 9/2011 | Jorgenson et al. | |
| 8,095,015 B2 | 1/2012 | Ichino | |
| 8,117,469 B2 | 2/2012 | Schmitz et al. | |
| 8,312,299 B2 | 11/2012 | Tremel et al. | |
| 8,442,697 B2 | 5/2013 | Schmitz et al. | |
| 2012/0250443 A1* | 10/2012 | Saraswat .................. | G11O 5/14 365/226 |
| 2014/0333134 A1* | 11/2014 | Hoberman ............ | G06F 1/3203 307/31 |
| 2015/0160718 A1* | 6/2015 | Cui ........................ | G06F 1/3203 713/320 |
| 2015/0324281 A1* | 11/2015 | Takefman ........... | G06F 12/0246 711/103 |

* cited by examiner

*Primary Examiner* — Richard Elms
*Assistant Examiner* — Ajay Ojha
(74) *Attorney, Agent, or Firm* — Wong & Rees LLP

(57) ABSTRACT

A memory module with power management system, and a method of operation of a memory module with power management system thereof, including: a base power plane; a power management circuit electrically connected to the base power plane; a managed power plane electrically connected to the base power plane only through the power management circuit; and a memory array electrically connected to the managed power plane.

18 Claims, 4 Drawing Sheets

MEMORY MODULE WITH POWER MANAGEMENT SYSTEM AND METHOD OF OPERATION THEREOF

TECHNICAL FIELD

The present invention relates generally to a memory module, and more particularly to a system for power management within the memory module.

BACKGROUND ART

There is a continual need in the area of electronics and electronic computing systems toward smaller systems and/or systems with greater computing performance for a given space and within a given power profile. Within these systems, the integrated circuit and memory modules are the building block used in high performance electronic systems to provide applications for usage in products such as automotive vehicles, computers, servers, data centers, cell phones, intelligent portable military devices, aeronautical spacecraft payloads, and a vast line of other similar products that require small compact electronics supporting many complex functions.

Products must compete in world markets and attract many consumers or buyers in order to be successful. It is very important for products to continue to improve in features, performance, and reliability while reducing product costs, product size, and to be available quickly for purchase by the consumers or buyers. As environmental concerns grow larger in the mind of consumers, power management becomes more and more important. In a time of devices which must work on demand, it is not enough to simply turn off unused components, which can impact the user experience.

Thus, a need still remains for robust and easily implemented power management of integrated circuit devices and components. In view of the strong demand for "green" products, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of operation of a memory module with power management system that includes providing a base power plane and a managed power plane; electrically connecting the base power plane and the managed power plane only through a power management circuit; electrically connecting a memory array to the managed power plane; monitoring power usage of the memory array with the power management circuit; and modifying input voltage to the managed power plane based on the power usage of the memory array.

The present invention provides a memory module with power management system that includes a base power plane; a power management circuit electrically connected to the base power plane; a managed power plane electrically connected to the base power plane only through the power management circuit; and a memory array electrically connected to the managed power plane.

Certain embodiments of the invention have other steps or elements in addition to or in place of those mentioned above. The steps or element will become apparent to those skilled in the art from a reading of the following detailed description when taken with reference to the accompanying drawings.

BEST MODE FOR CARRYING OUT THE INVENTION

Figure 1:
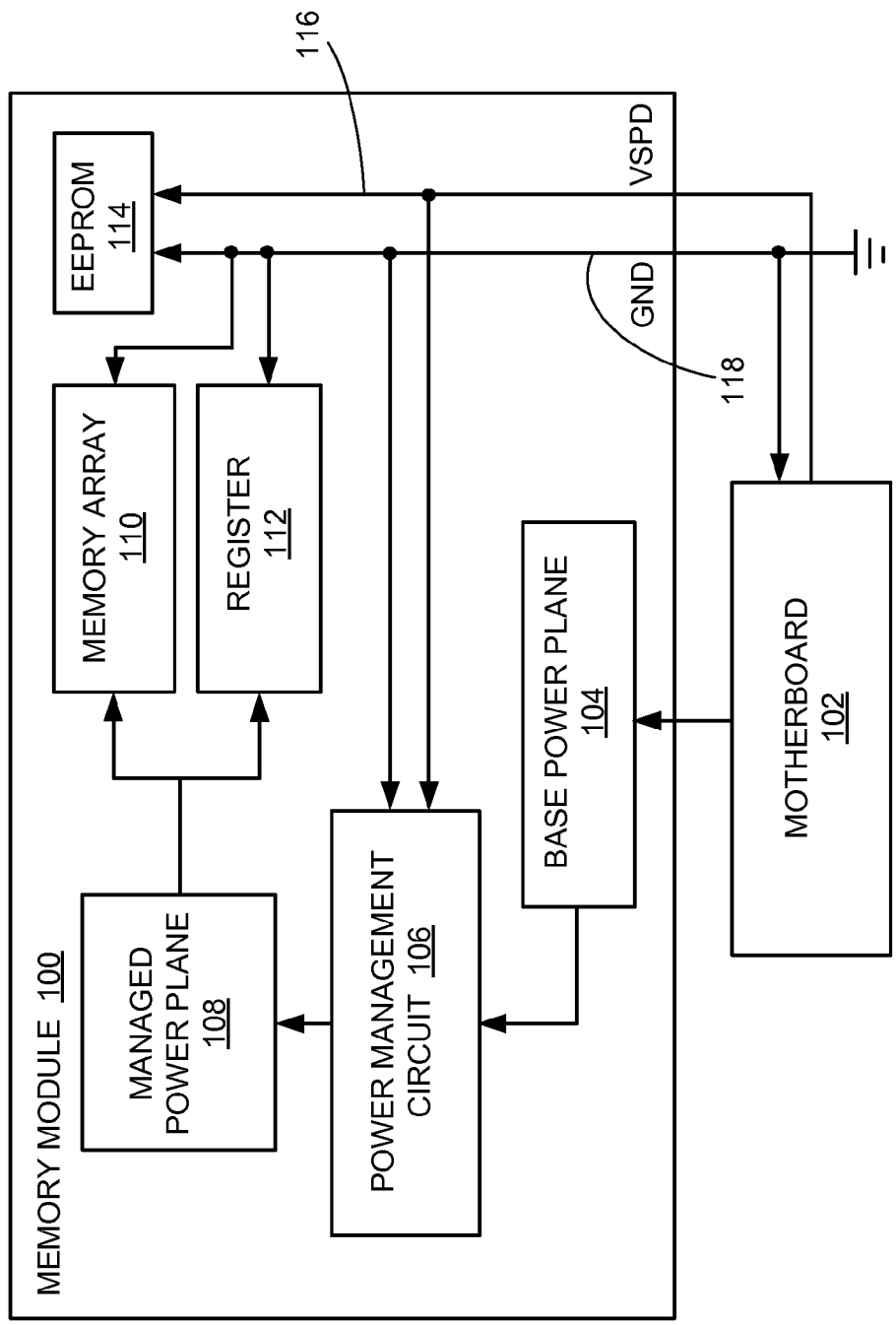
FIG. 1 is a functional block diagram of a memory module with a power management system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined s a plane parallel to the plane or connection surface of the DIMM (dual in-line memory module), regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" means that there is direct contact between elements. The term "directly on"

means that there is direct contact between one element and another element without an intervening element.

The term "active side" refers to a side of a die, a module, a package, or an electronic structure having active circuitry fabricated thereon or having elements for connection to the active circuitry within the die, the module, the package, or the electronic structure.

Referring now to FIG. 1, therein is shown a functional block diagram of a memory module 100 with a power management system in a first embodiment of the present invention. The memory module 100 can be electrically coupled to a motherboard 102. The memory module 100 can include a base power plane 104, a power management circuit 106, a managed power plane 108, a memory array 110, a register 112, and an EEPROM (electrically erasable programmable read-only memory) 114.

The memory module 100 is defined as a device for holding data to be accessed in any order or in bursts for use during the operation of the various components connected to the motherboard 102. For example, the memory module 100 can be a dual in-line memory module (DIMM) and which can take many forms such as RDIMMs, SO-DIMMs (Small Outline DIMMs), Mini-DIMMs, Micro-DIMMs, or other types of memory modules.

The motherboard 102 can provide power to various components of the memory module 100. For example, the motherboard 102 can provide power to the base power plane 104 and separately to the EEPROM 114 through an input power plane 116. In this figure, for example only, the input power plane 116 is also labeled as VSPD (more commonly shown as $V_{SPD}$ or $V_{DDSPD}$, which stands for serial presence detect). The input power plane 116 supplies input voltage to the EEPROM 114. The EEPROM 114 is also connected to a ground plane 118, which is labeled in this example in this figure as GND.

The base power plane 104 can also be called the VDD (also $V_{DD}$) power plane, and is defined as the first power plane used to pass power to the memory array 110. The motherboard 102 first passes power to the base power plane 104 through various inputs of the memory module 100. The base power plane 104 aggregates power from the motherboard 102 and sends it directly to the power management circuit 106. The base power plane 104 is electrically coupled to the power management circuit 106. The power management circuit 106 is electrically coupled to the managed power plane 108, which is electrically coupled to the memory array 110 and the register 112. The managed power plane 108 can also be called the VDDMEM power plane (or $V_{DDMEM}$) to differentiate it from the VDD power plane. The base power plane 104 is electrically coupled to the managed power plane 108 only through the power management circuit 106, and is never directly coupled to the managed power plane 108.

The power management circuit 106 can take the form of a chip containing the power management circuitry or the circuitry of the power management circuit 106 can be embedded directly within the memory module 100. Though the power management circuit 106 is described as a circuit, it may also be a self-contained chip or integrated circuit package, for example.

The power management circuit 106 sits between the managed power plane 108 and the base power plane 104, which are only connected through the power management circuit 106. This illustrates a split of what is typically one power plane (typically called the VDD power plane) with the power management circuit 106 sitting in between the now two sides of the split power plane.

The memory array 110 and the register 112 draw power through the managed power plane 108. The memory array 110 can include many different types of volatile and non-volatile memory such as random access memory (RAM) including DDR SDRAM, DDR2 SDRAM, DDR3 SDRAM, DDR4 SDRAM, and other implementations of RAM on a memory module. The register 112 can take various forms and can include a register, a memory buffer, a data buffer, or some combination thereof, for example.

The power management circuit 106 can monitor the managed power plane 108 in order to see how much power the memory array 110 or the register 112 are demanding. When the memory array 110 is idle, the power or input voltage supplied to the managed power plane 108 is reduced. As the demand for current by the memory array 110 increases, the power supply to the managed power plane 108 is increased in real-time to provide the necessary power. The base power plane 104 can appear to the motherboard 102 to be the same as a typical VDD power plane, and the motherboard 102 does not need to be modified to deal with the managed power plane 108. The managed power plane 108 can be managed entirely by the power management circuit 106, for example.

It has been discovered that having the power management circuit 106 manage the power to the memory array 110 can allow the memory module 100 with the power management circuit 106 to be a direct replacement for standard memory modules with no change to the motherboard 102. Because the motherboard 102 sends power to the base power plane 104 which appears the same to the motherboard 102 as a typical VDD power plane, and the power management is all internal to the memory module 100, no additional code or hardware is required for the motherboard 102 to use the memory module 100. Additionally, the use of the power management circuit 106 can keep the memory module 100 within Joint Electron Device Engineering Council (JEDEC) mechanical and electrical standards, which allows for the memory module 100 to be interchangeable with typical memory modules lacking a power management system.

It has been discovered that by splitting what is typically one power plane (sometimes called the VDD power plane) into the base power plane 104 and the managed power plane 108 with the power management circuit 106 between them, the power usage efficiency of the memory module 100 can be increased greatly. Because the power management circuit 106 can monitor the power usage of the memory array 110 through the managed power plane 108, the power management circuit 106 can intelligently determine when to increase or decrease the voltage which determines how much current flows to the memory array 110. Intelligent reduction of power usage based on what the memory array 110 is requiring by the power management circuit 106 allows for anywhere from a 10% to 25% decrease in power usage.

It has also been discovered that splitting the typical VDD power plane into the base power plane 104 and the managed power plane 108 with the power management circuit 106 between them allows for greater reliability of the memory module 100. As described above, there is a reduction in power usage as a result of the monitoring of power by the power management circuit 106. This reduction in power consumption translates directly into the reduction in heat generated by the memory module 100. This lower operating temperature of up to 10° C. cooler than a standard memory module can lead to greater reliability and longer life for the memory module 100 due to less damage from heat. This in turn can also reduce overall system temperatures and can result in better performance due to reduced throttling of other processors within the system when those processors throttle under heat related conditions.

Also shown in this figure is the power management circuit 106 electrically connected to the input power plane 116 and the ground plane 118. This can be done in order to isolate the power supply of the power management circuit 106 from that of the memory array 110 in order to cut down on potential interference. The use of the input power plane 116 can keep the power to the power management circuit 106 itself more stable; fluctuations of the power due to varying demands from the memory array 110 can be avoided. This connection to the input power plane 116 is for illustrative purposes only, and it is understood that the power management circuit 106 can be connected to other power supplies as necessary or convenient.

In a standard memory module, it is standard to reference address, command, control, and clock signals for the memory module to the VDD input. However, in the memory module 100, because the base power plane 104 and the managed power plane 108 are split by the power management circuit 106, voltage instability means that the aforementioned signals should not be referenced to either the base power plane 104 or the managed power plane 108. A solution to this problem is to reference the address, command, control, and clock signals for the memory module 100 to the ground plane 118. In order to reference the signals for the memory module 100 to ground properly, additional decoupling capacitors (not shown) can be added to the design in order to create a proper return path.

The memory array 110 can contain multiple ranks or multiple independent sets of memory chips. As is well understood in the art, each rank is independent of the other ranks. For illustrative purposes, the memory array 110 has been described as being managed by just one of the power management circuit 106. However, it is understood that other configurations are possible. For example, each rank within the memory array 110 can be managed by its own instance of the power management circuit 106. In this example, greater power savings may be achieved due to the fact that in general, only one rank within the memory array 110 will be active at any given time. This means that each idle rank connected to its own power management circuit (such as the power management circuit 106) will require less power and can have power drawn by those idle ranks reduced rather than having one rank within the memory array 110 cause an increase in power draw for the entire memory array 110. As another example, the power management circuit 106 can also be assigned to two ranks, four ranks, or any subset of the total number of ranks within the memory array 110. The total number of power management circuits used can be adjusted as necessary depending on available space within the physical structure of the memory module 100.

Figure 2:
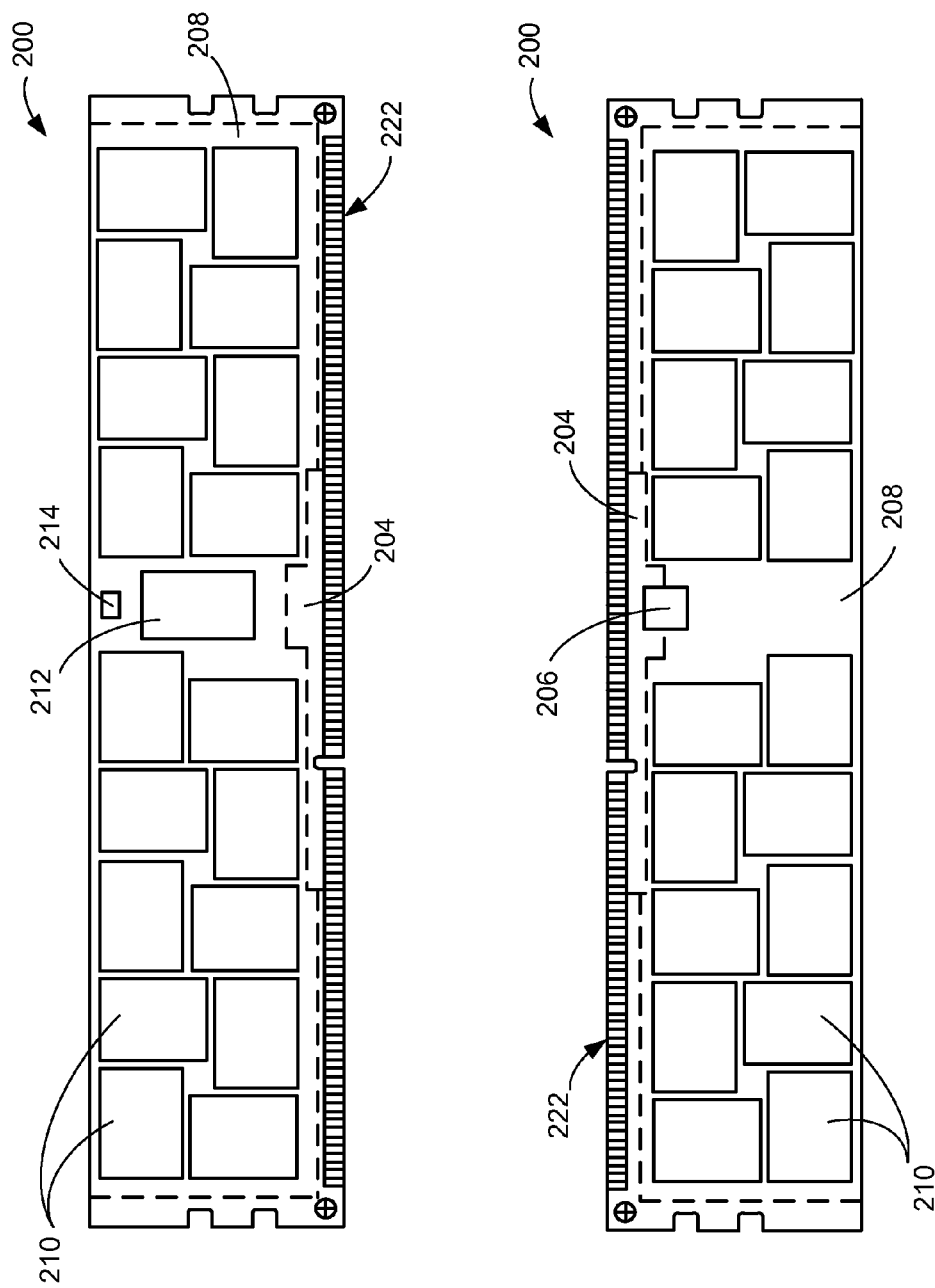
FIG. 2 is a double sided view of a memory module in a second embodiment of the present invention.

Referring now to FIG. 2, therein is shown a double sided view of a memory module 200 in a second embodiment of the present invention. The figure shows two sides of the same memory module, and the bottom portion can be considered as the view after rotating the top portion around an imaginary line between the two portions of the figure. This is why the two views of the memory module 200 are not simply mirror images of one another, though they do share some of the same elements.

The memory module 200 is an example of the physical structure of a memory module, though it is understood that this physical structure is for example only, and that different physical configurations are possible. In the top portion of the figure is shown one side of the memory module 200 with the various chips of a memory array 210, a register 212, and an EEPROM 214 clearly visible. Only two of the chips of the memory array 210 are labeled, though it is understood that the other chips currently unlabeled can also be chips within the memory array 210. Shown with dotted lines are a base power plane 204 and a managed power plane 208; these power planes are physically separate from one another and are represented by dotted lines in order to show that the power planes are physically located within the board of the memory module 200 rather than being exposed on the surface. As can be seen more clearly in the bottom portion of this figure, the base power plane 204 and the managed power plane 208 are linked together by a power management circuit 206.

For illustrative purposes, the power management circuit 206 is shown as a self-contained chip located in particular spot physically directly between the base power plane 204 and the managed power plane 208, although it is understood that the power management circuit 206 can be located in other locations or take other forms so long as room for appropriate circuitry and traces is available. For example, the power management circuit 206 can take the form of a self-contained chip or integrated circuit package, or the power management circuit 206 can be the circuitry itself. If the power management circuit 206 takes the form of an integrated circuit package, for example, the power management circuit 206 can be stacked on top of other chips in order to save space and share a power supply with other chips such as the register 212 or the EEPROM 214. Also for example, the power management circuit 206 can be the power management circuitry itself or an integrated circuit package embedded within the board of the memory module 200. It is understood that the power management circuit 206 does not need to be physically between the base power plane 204 and the managed power plane 208 so long as the power management circuit 206 is electrically in between the two power planes.

Electrical signals and power can be provided to the memory module 200 through input pins 222, which can also be called gold fingers. The input voltage can be supplied separately to the EEPROM 214 and to the base power plane 204. The base power plane 204 aggregates this power from the various pins of the input pins 222 and sends it directly to the power management circuit 206. The base power plane 204 is electrically coupled to the power management circuit 206. The power management circuit 206 is in turn electrically coupled to the managed power plane 208, which is electrically coupled to the various chips of the memory array 210 and the register 212.

The power management circuit 206 sits between the managed power plane 208 and the base power plane 204, which are only connected through the power management circuit 206. This illustrates a split of what is typically one power plane (typically called the VDD power plane) with the power management circuit 206 sitting in between the now two sides of the split power plane. The memory array 210 and the register 212 draw power through the managed power plane 208. The memory array 210 can include many different types of volatile and nonvolatile memory such as random access memory (RAM) including DDR SDRAM, DDR2 SDRAM, DDR3 SDRAM, DDR4 SDRAM, and other implementations of RAM on a memory module.

The power management circuit 206 can monitor the managed power plane 208 in order to see how much power the memory array 210 or the register 212 are demanding. When the memory array 210 is idle, the power or voltage supplied to the managed power plane 208 is reduced. As the demand for current by the memory array 210 increases, the power supply to the managed power plane 208 is increased in real-time to provide the necessary power. For example, the base power plane 204 can appear to the motherboard 102 of FIG. 1 to be the same as a typical VDD power plane, and the motherboard 102 does not need to be modified to deal with the managed power plane 208 or the fact that the power plane has now been split in two. The managed power plane 208 can be managed entirely by the power management circuit 206, for example.

It has been discovered that having the power management circuit 206 manage the power to the memory array 210 can allow the memory module 200 with the power management circuit 206 to be a direct replacement for standard memory modules with no change to the motherboard 102. Because the motherboard 102 sends power to the base power plane 204 which appears the same to the motherboard 102 as a typical VDD power plane, and the power management is all internal to the memory module 200, no additional code or hardware is required for the motherboard 102 to use the memory module 200. Additionally, the use of the power management circuit 206 can keep the memory module 200 within JEDEC mechanical and electrical standards, which allows for the memory module 200 to be fully interchangeable with typical memory modules lacking a power management system.

It has been discovered that by splitting what is typically one power plane (sometimes called the VDD power plane) into the base power plane 204 and the managed power plane 208 with the power management circuit 206 between them, the power usage efficiency of the memory module 200 can be increased greatly. Because the power management circuit 206 can monitor the power usage of the memory array 210 through the managed power plane 208, the power management circuit 206 can intelligently determine when to increase or decrease the voltage. Intelligent reduction of power usage based on what the memory array 210 is requiring by the power management circuit 206 allows for anywhere from a 10% to 25% decrease in power usage.

It has also been discovered that splitting the typical VDD power plane into the base power plane 204 and the managed power plane 208 with the power management circuit 206 between them allows for greater reliability of the memory module 200. As described above, there is a reduction in power usage as a result of the monitoring of power by the power management circuit 206. This reduction in power consumption translates directly into the reduction in heat generated by the memory module 200. This lower operating temperature of up to 10° C. cooler than a standard memory module can lead to greater reliability and longer life for the memory module 200 due to less damage from heat. This in turn can also reduce overall system temperatures and can result in better performance due to reduced throttling of other processors within the system when those processors throttle under heat related conditions.

Figure 3:
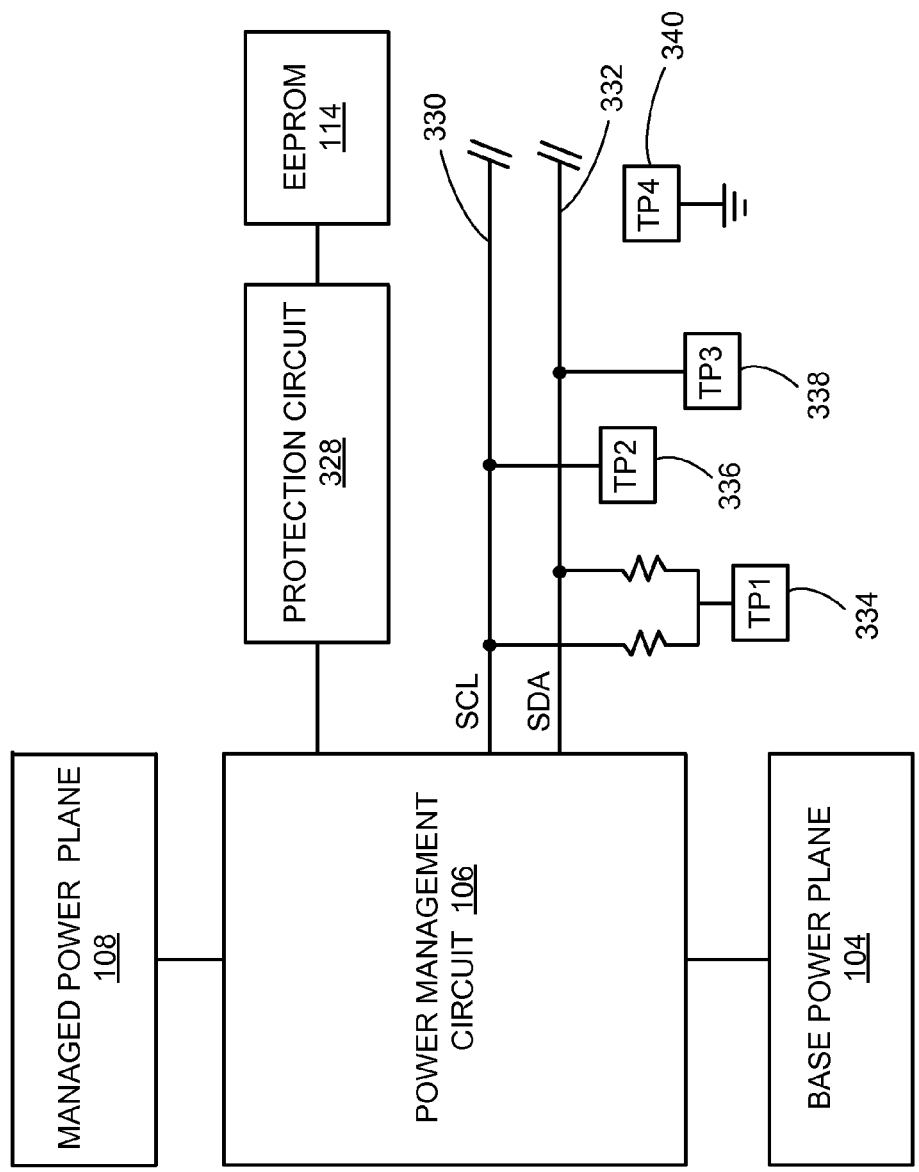
FIG. 3 is a more detailed view of features and components which may reside within the memory module of FIG. 1.

Referring now to FIG. 3, therein is shown a more detailed view of features and components which may reside within the memory module 100 of FIG. 1. In this view can be seen a more simplified functional block diagram with the power management circuit 106 between the base power plane 104 and the managed power plane 108. The power management circuit is also shown electrically connected to the EEPROM 114.

Standard memory modules contain an I2C (I-squared-C, IIC, or inter-integrated circuit) bus for connecting various components within the memory module. A connection to the I2C bus can also be used to program any of the components attached to the bus, as each of the components has its own address. However, it has been found that simply connecting the power management circuit 106 to the I2C bus for power and addressing purposes can cause interference and conflicts with other devices also connected to the I2C bus. The inventors have discovered that it was necessary to disconnect the power management circuit 206 from the I2C bus in order to avoid this conflict or interference. In order to effect this disconnect from the I2C bus, it was necessary to cut a serial clock line 330 (shown in the figure as SCL) and a serial data line 332 shown in the figure also as SDA), with the disconnection represented as a pair of parallel slashes on both the serial clock line 330 and the serial data line 332.

Due to the serial clock line 330 and the serial data line 332 being disconnected from the I2C bus, it became necessary to add test points in order for programming of the power management circuit 106 to be possible. A first test point 334 is electrically connected to the serial clock line 330 and the serial data line 332 through resistors in this example. A second test point 336 is attached to the serial clock line 330 in this example. A third test point 338 is connected to the serial data line 332 in this example. A fourth test point 340 is connected to ground in this example. The first test point 334, the second test point 336, the third test point 338, and the fourth test point 340 are used to allow for programming of the power management circuit 106. It is understood that the particular configuration and numbers of test points are for example only and that other configurations are possible. The test points can allow for the power management circuit 106 to be programmed in advance of attachment or on the memory module 100 itself.

The EEPROM 114 can take different forms and have different properties depending on the application. If the EEPROM 114 is one that can be reversibly locked, it has been found that a protection circuit 328 is necessary to protect the power management circuit 106 from damage. A reversibly locked EEPROM can be opened or unlocked for rewriting by applying a high voltage on the proper pin to the EEPROM 114, for example. Because the power management circuit 106 in this example is electrically connected to the EEPROM 114, this high voltage can potentially damage the power management circuit 106 during the process of locking or unlocking the EEPROM 114. The protection circuit 328 can protect the power management circuit 106 by providing an alternate path for current, for example. As an example, the protection circuit can take the form of a Zener diode connected to ground.

Figure 4:
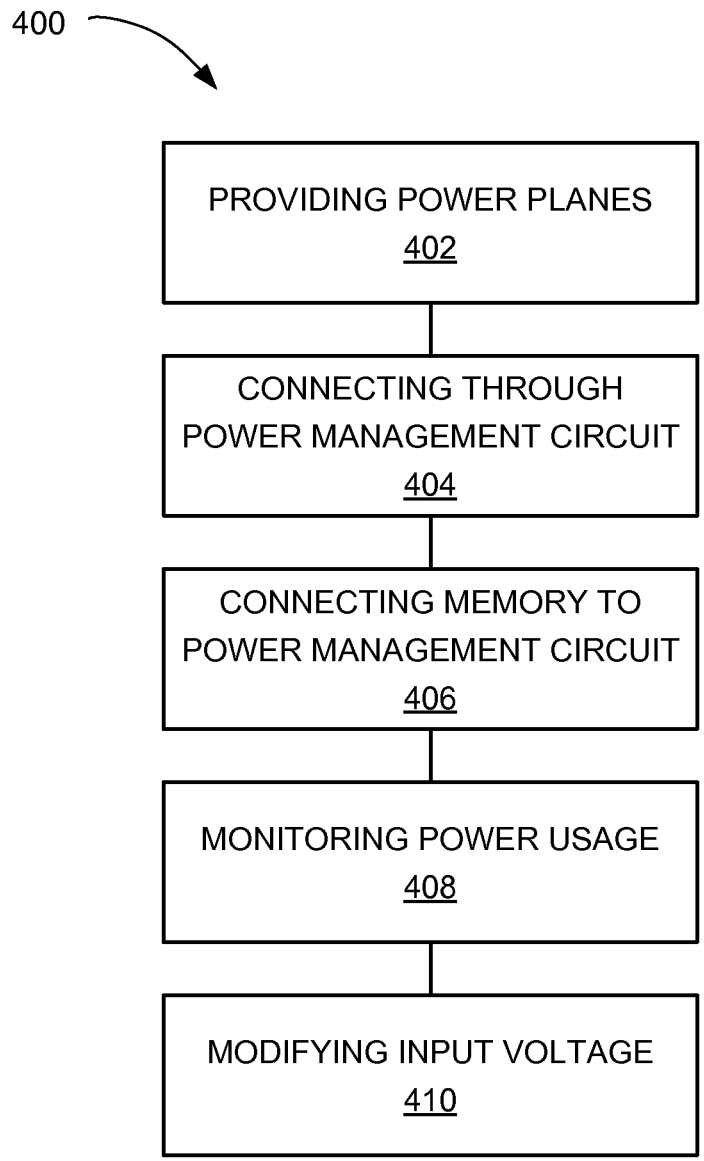
FIG. 4 is a flow chart of a method of operation of a memory module with power management system in a further embodiment of the present invention.

Referring now to FIG. 4, therein is shown a flow chart of a method 400 of operation of a memory module with power management system in a further embodiment of the present invention. The method 400 includes: providing a base power plane and a managed power plane in a block 402; electrically connecting the base power plane and the managed power plane only through a power management circuit in a block 404; electrically connecting a memory array to the managed power plane in a block 406; monitoring power usage of the memory array with the power management circuit in a block 408; and modifying input voltage to the managed power plane based on the power usage of the memory array in a block 410.

The resulting method, process, apparatus, device, product, and/or system is straightforward, cost-effective, uncomplicated, highly versatile, accurate, sensitive, and effective, and can be implemented by adapting known components for ready, efficient, and economical manufacturing, application, and utilization.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hitherto fore set forth herein or shown in the accompanying drawings are to be interpreted in an illustrative and non-limiting sense.

What is claimed is:

1. A method of operation of a memory module with power management system comprising:
   providing a base power plane and a managed power plane;
   electrically connecting the base power plane and the managed power plane through a power management circuit;
   electrically connecting a memory array to the managed power plane;
   monitoring power usage of the memory array by monitoring power usage of ranks within the memory array with at least the power management circuit and another power management circuit, the power management circuit and the another power management circuit monitoring different ranks within the memory array; and
   modifying input voltage to the managed power plane based on the power usage of the memory array.

2. The method as claimed in claim 1 further comprising electrically connecting a register to the managed power plane.

3. The method as claimed in claim 1 further comprising electrically connecting the base power plane to a motherboard.

4. The method as claimed in claim 1 further comprising:
   electrically connecting the base power plane to a motherboard; and
   electrically connecting an EEPROM to the motherboard.

5. A method of operation of a memory module with power management system comprising:
   providing a base power plane and a managed power plane;
   electrically connecting the base power plane to a motherboard;
   electrically connecting an EEPROM to the motherboard;
   electrically connecting the base power plane and the managed power plane through a power management circuit;
   electrically connecting a memory array to the managed power plane;
   electrically connecting a register to the managed power plane;
   monitoring power usage of the memory array by monitoring power usage of ranks within the memory array with at least the power management circuit and another power management circuit, the power management circuit and the another power management circuit monitoring different ranks within the memory array; and
   modifying input voltage to the managed power plane based on the power usage of the memory array.

6. The method as claimed in claim 5 further comprising stacking the power management circuit on the register.

7. The method as claimed in claim 5 further comprising stacking the power management circuit on the EEPROM.

8. The method as claimed in claim 5 further comprising providing a printed circuit board having the power management circuit embedded within the printed circuit board.

9. The method as claimed in claim 5 further comprising connecting test points to the power management circuit for programming the power management circuit.

10. A memory module with power management system comprising:
    a base power plane;
    a power management circuit electrically connected to the base power plane;
    a managed power plane electrically connected to the base power plane through the power management circuit;
    a memory array electrically connected to the managed power plane; and
    another power management circuit electrically connected to the base power plane wherein the power management circuit and the another power management circuit are monitoring the power usage of the memory array by monitoring power usage of ranks within the memory array, and the power management circuit and the another power management circuit are monitoring different ranks within the memory array.

11. The memory module as claimed in claim 10 further comprising a register electrically connected to the managed power plane.

12. The memory module as claimed in claim 10 further comprising a motherboard electrically connected to the base power plane.

13. The memory module as claimed in claim 10 further comprising:
    a motherboard electrically connected to the base power plane; and
    an EEPROM electrically connected to the motherboard.

14. The memory module as claimed in claim 10 further comprising:
    a motherboard electrically connected to the base power plane;
    an EEPROM electrically connected to the motherboard; and
    a register electrically connected to the managed power plane.

15. The memory module as claimed in claim 14 wherein the power management circuit is stacked on the register.

16. The memory module as claimed in claim 14 wherein the power management circuit is stacked on the EEPROM.

17. The memory module as claimed in claim 14 wherein the power management circuit is embedded in a printed circuit board of the memory module.

18. The memory module as claimed in claim 14 further comprising test points connected to the power management circuit for programming the power management circuit.

* * * * *